United States Patent [19]
Das et al.

[11] Patent Number: 5,835,520
[45] Date of Patent: Nov. 10, 1998

[54] VERY NARROW BAND KRF LASER

[75] Inventors: Palash Parijat Das, Vista; Alexander I. Ershov, San Diego, both of Calif.

[73] Assignee: Cymer, Inc., San Diego, Calif.

[21] Appl. No.: 842,305

[22] Filed: Apr. 23, 1997

[51] Int. Cl.⁶ .................................................. H01S 3/22

[52] U.S. Cl. .................. 372/57; 372/20; 372/99; 372/100

[58] Field of Search .................. 372/57, 86, 20, 372/19, 99, 100

[56] References Cited

U.S. PATENT DOCUMENTS 5,559,816  9/1996  Basting et al. ............................ 372/27

*Primary Examiner*—Leon Scott, Jr.
*Attorney, Agent, or Firm*—John R. Ross, Esq.

[57] ABSTRACT

A very narrow band KrF excimer laser capable of producing 10 mJ laser pulses at 1000 Hz with a bandwidth of less than 0.6 nm (FWHM). The very narrow bandwidth is achieved by reducing fluorine partial pressure to less than 0.08 and by increasing the reflectance of the output coupler to greater than 25 percent. In a preferred embodiment, prior art fused silica beam expansion prisms used in the prior art line narrowing module were replaced with calcium fluoride prisms.

4 Claims, 11 Drawing Sheets

VERY NARROW BAND KRF LASER

BACKGROUND OF THE INVENTION

KrF excimer lasers are currently becoming the workhorse light source for the integrated circuit lithography industry. A typical prior art KrF excimer laser is depicted in FIG. 1 and FIG. 9. A pulse power module AE provides electrical pulses lasting about 100 ns to electrodes 6 located in a discharge chamber 8. The electrodes are about 28 inches long and are spaced apart about 3/5 inch. Typical lithography lasers operated at a high pulse rate of about 1,000 Hz. For this reason it is necessary to circulate a laser gas (about 0.1 percent fluorine, 1.3 percent krypton and the rest neon which functions as a buffer gas) through the space between the electrodes. This is done with tangential blower 10 located in the laser discharge chamber. The laser gasses are cooled with a heat exchanger also located in the chamber. Commercial excimer laser system are typically comprised of several modules which may be replaced quickly without disturbing the rest of the system. Principal modules are shown in FIG. 2 and include:

Laser Chamber 8,

Pulse Power Module 2,

Output coupler 16,

Line Narrowing Module 18

Wavemeter 20

Computer Control Unit 22

Peripheral Support Sub systems

The discharge chamber is operated at a pressure of about three atmospheres. These lasers operate in a pulse mode at about 600 Hz to about 1,000 Hz, the energy per pulse being about 10 mJ and the duration of the laser pulses is about 15 ns. Thus, the average power of the laser beam is about 6 to 10 Watts and the average power of the pulses is in the range of about 700 KW.

It is well known that at wavelengths below 300 nm there is only one suitable optical material available for building the stepper lens used for chip lithography. This material is fused silica. An all fused silica stepper lens will have no chromatic correction capability. The KrF excimer laser has a natural bandwidth of approximately 300 pm (full width half maximum). For a refractive system (with NA>0.5)—either a stepper or a scanner—this bandwidth has to be reduced to below 1 pm. Current prior art commercially available laser systems can provide KrF laser beams at a nominal wave length of about 248 nm with a bandwidth of about 0.8 pm (0.0008 nm). Wavelength stability on the best commercial lasers is about 0.25 pm. With these parameters stepper makers can provide stepper equipment to provide integrated circuit resolutions of about 0.3 microns.

To improve resolution a more narrow bandwidth is required. For example, a reduction of a bandwidth to below 0.6 pm would permit improvement of the resolution to below 0.25 microns.

The actual performance of the stepper then depends critically on maintaining minimum bandwidth of the laser throughout it's operational lifetime. Therefore, a need exist for a reliable, production quality excimer laser system, capable of long-term factory operation and having wavelength stability of less than 0.2 pm and a bandwidth of less than 0.5 pm.

SUMMARY OF THE INVENTION

The present invention provides a very narrow band KrF excimer laser capable of producing 10 mJ laser pulses at 1000 Hz with a bandwidth of less than 0.6 nm (FWHM). The very narrow bandwidth is achieved by reducing fluorine partial pressure to less than 0.08 and by increasing the reflectance of the output coupler to greater than 25 percent. In a preferred embodiment, prior art fused silica beam expansion prisms used in the prior art line narrowing module were replaced with calcium fluoride prisms.

DETAILED DESCRIPTION OF PREFERRED EMBODIMENTS

Figure 1:
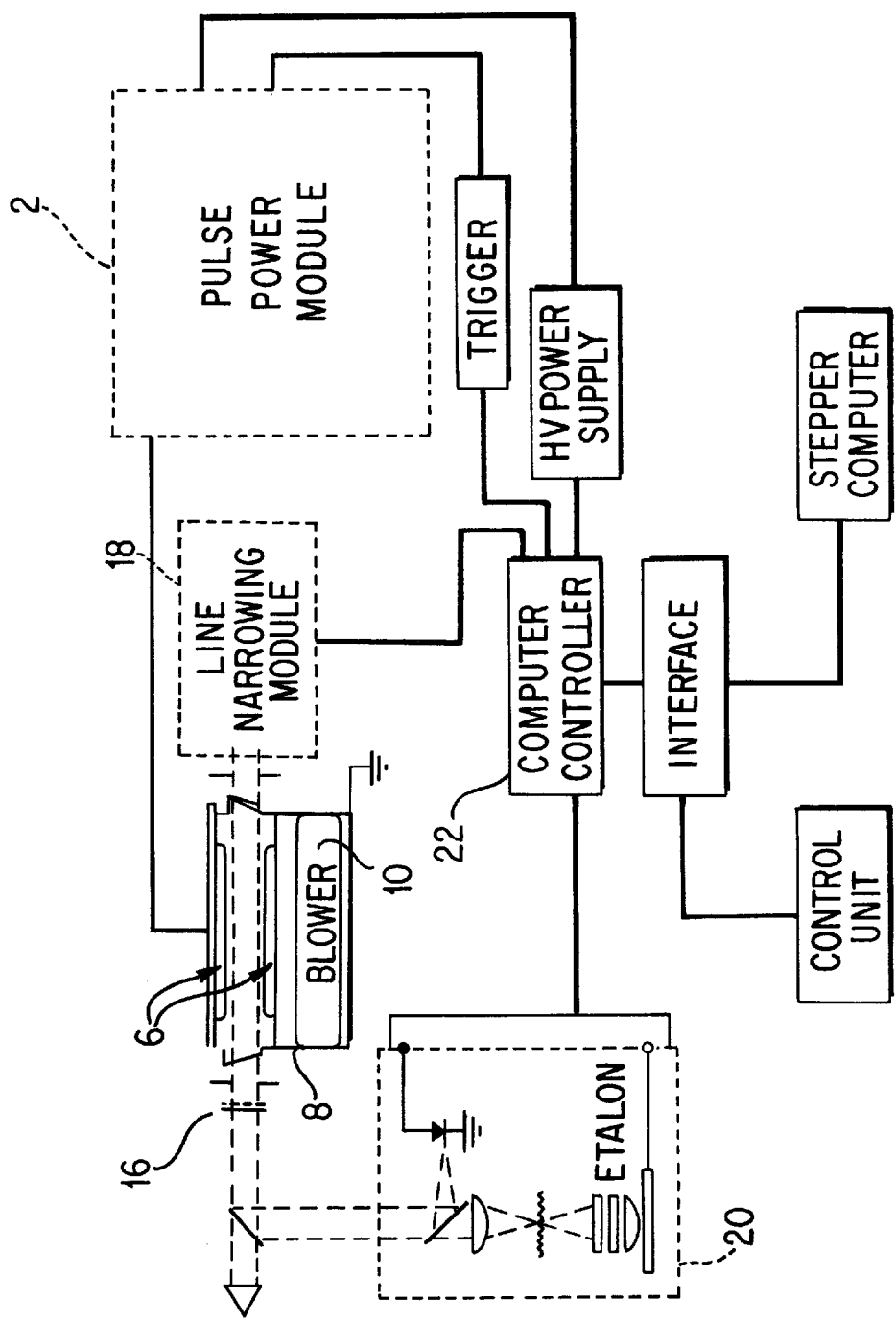
FIG. 1 is a drawing showing the principal elements of a prior art commercial KrF excimer lasers used for integrated circuit lithography.
Figure 2:
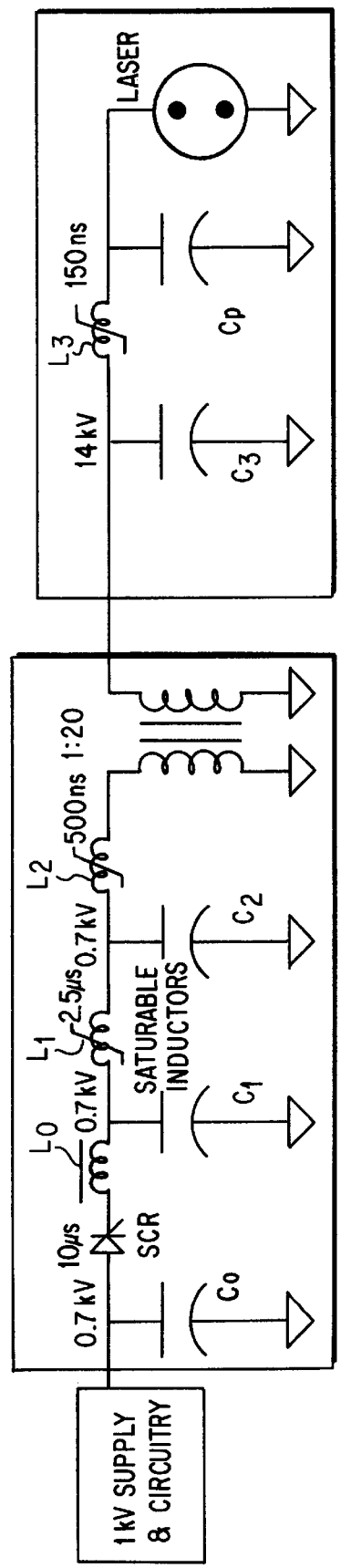
FIG. 2 is a simplified electrical drawing of a solid state pulse power circuit.

Preferred embodiments of the present invention are described below. FIG. 2 shows the principal elements of a commercial excimer laser system of the type used today in integrated circuit lithography.

The Chamber

The discharge chamber 10 is a vessel, designed to hold several atmospheres of corrosive gases These vessels are designed to known safety standards, such as those specified by ASME. The discharge region is defined by the two electrodes separated by a gap of 1.2 to 2.5 cm. The cathode is supported by an insulating structure since it is connected to the high voltage, while the anode is attached to the metal chamber as it is at ground potential. Preionization is done by corona discharge preionizers located on either side of the discharge region. Due to the corrosive nature of the gas the chambers use particular metals chosen to resist fluorine attack. The fluorine gas however, still reacts with the chamber internal parts such as chamber walls and electrodes; thus consuming fluorine and generating metal fluoride contaminants.

Since the laser is pulsed (500 to 1000 Hz), it is essential to clear the discharge region between pulses—a task preferably performed by a tangential blower, which is magnetically coupled to an external drive source. Heat is extracted from the laser gas by means of a water cooled finned heat exchanger inside the chamber. Metal fluoride dust is trapped by means of an electrostatic precipitator not shown. A small amount of laser gas is extracted from the chamber and is passed over negatively charged high field wires to trap the dust. The dust-free gas is then released over the windows to keep them clean. The gas is driven through the precipitator by the differential pressure built up inside the laser chamber due to the high velocity flow.

Pulse Power Module

Figure 3:
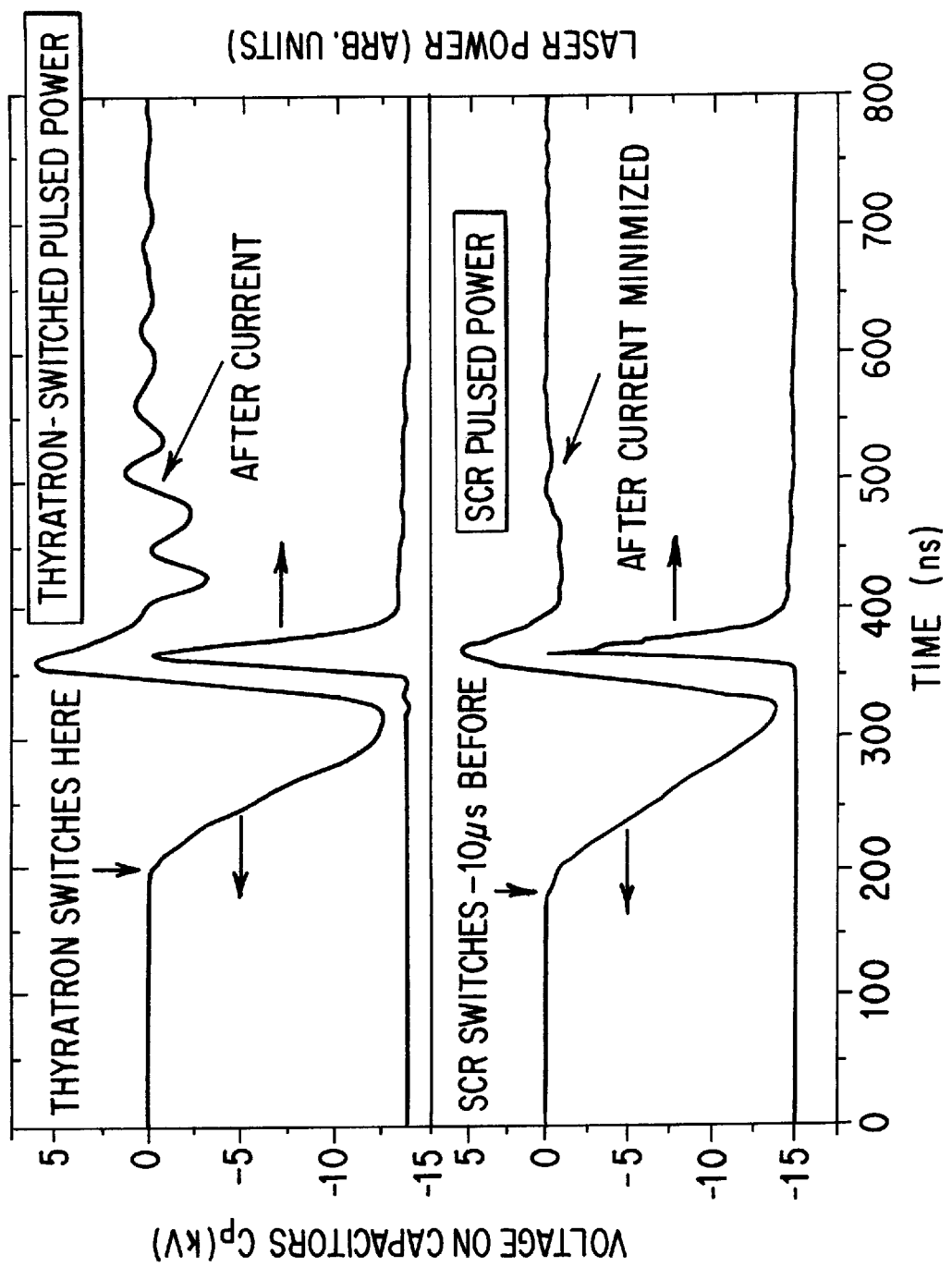
FIG. 3 are graphs comparing the results of a solid state pulse power circuit to a prior art thyratron based circuit.
Figure 4:
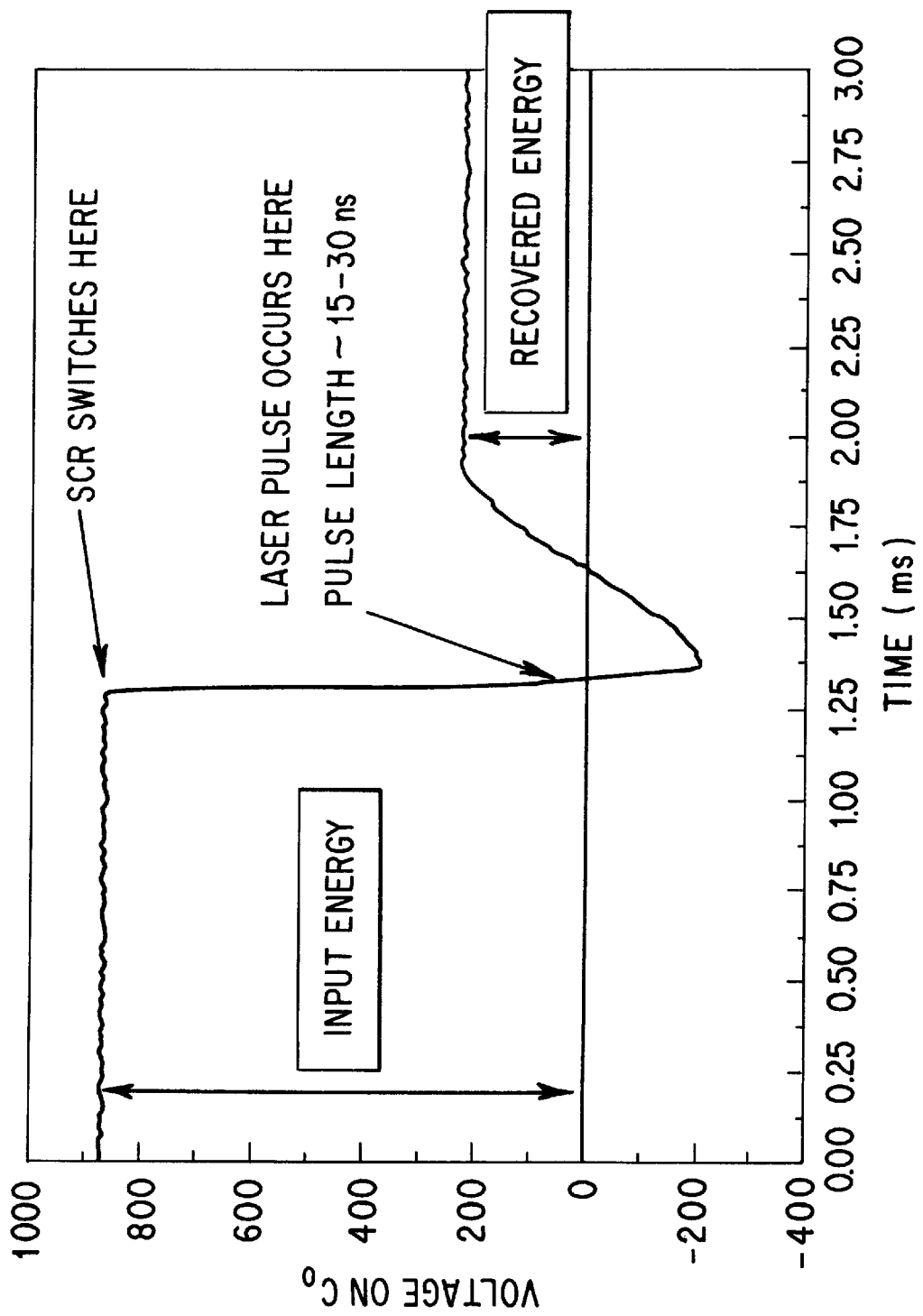
FIG. 4 is a graph of operating voltage during a pulse.
Figure 5:
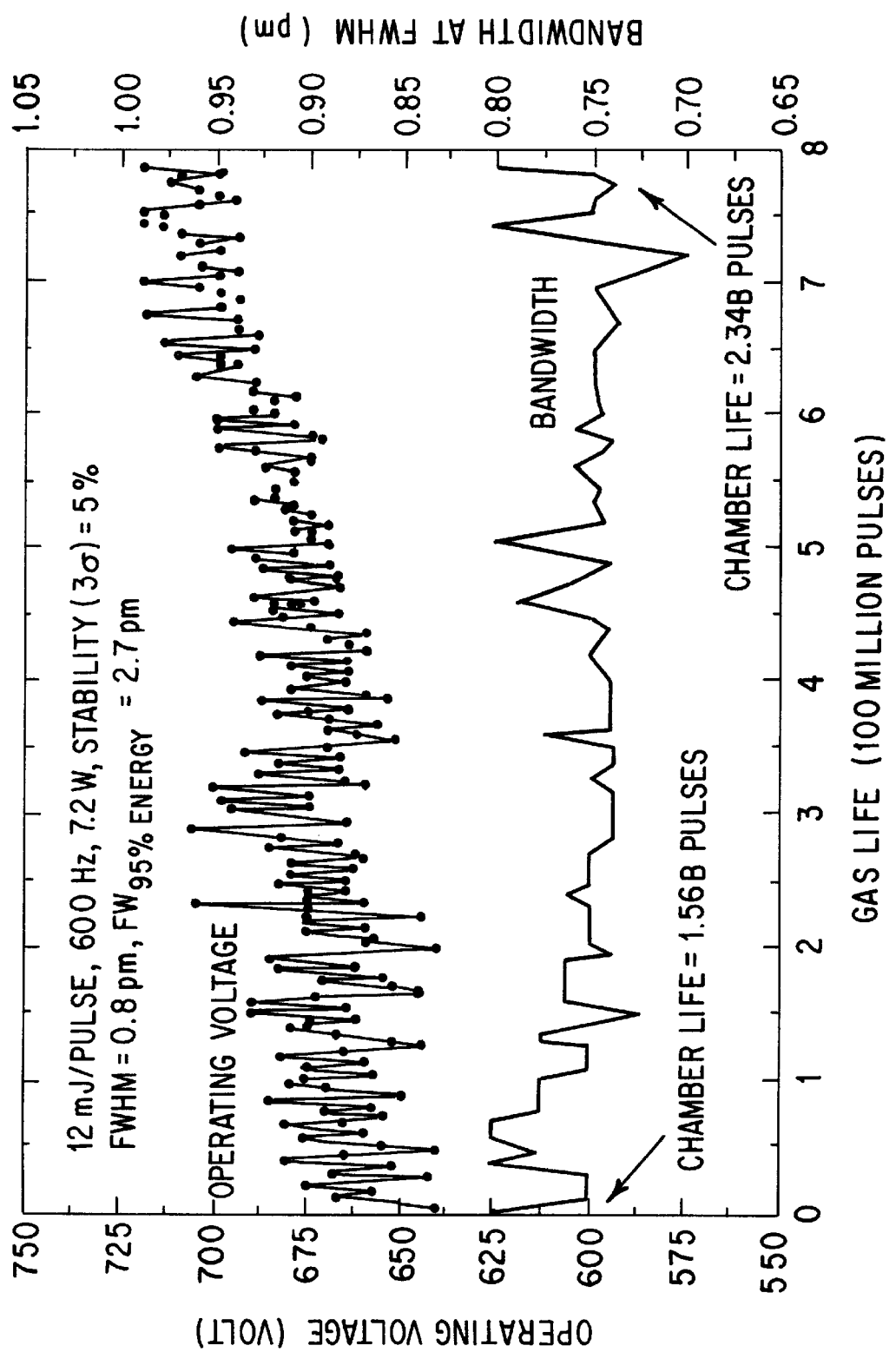
FIG. 5 shows a typical variation of operating voltage and bandwidth over an 800 million pulse period.
Figure 6:
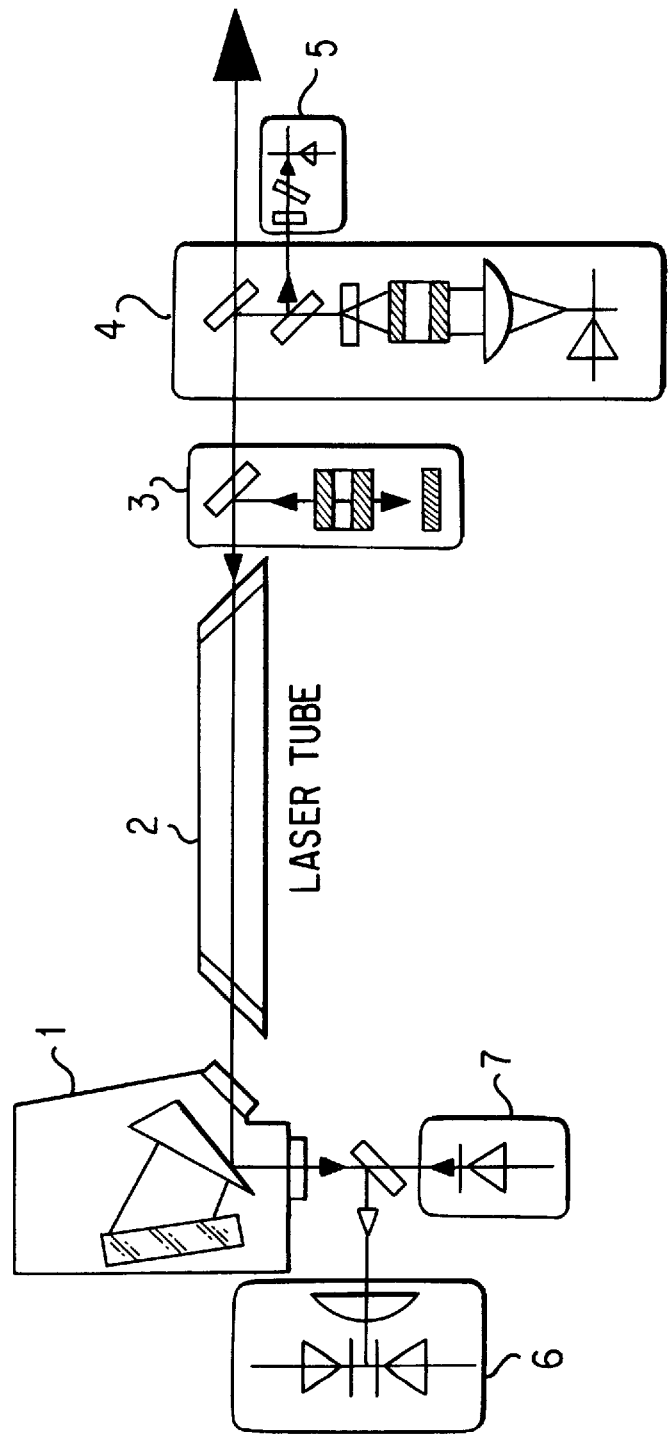
FIG. 6 is a simplified sketch of a KrF laser system.

This preferred embodiment utilizes a solid state pulsed power module (SSPPM) circuit shown in FIG. 2. The 20 KV power supply of prior art thyratron systems is replaced by a 1 kV supply. The thyratron switch is replaced by an SCR switch that does not feed $C_p$ directly, but instead switches the energy of $C_0$ into a pulse compression circuit formed by $C_1$, $C_2$, $C_3$, a step-up transformer, and three saturable inductors. The operation of this circuit is as follows. The DC charge stored on $C_0$ is switched through the SCR and the inductor $L_0$ into $C_1$. The saturable inductor, $L_1$, holds off the voltage on $C_1$ for approximately 2.5 s and then becomes conducting, allowing the transfer of charge from $C_1$ to $C_2$. The second saturable inductor, $L_2$, holds off the voltage on $C_2$ for approximately 500 ns and then allows the charge on $C_2$ to flow through the primary of 1:20 step-up transformer. The output from the step-up transformer is stored on $C_3$ until the saturable inductor $L_3$ becomes conducting in approximately 100–150 ns. The charge is then finally transferred through $L_3$ into $C_p$ and laser discharge occurs. The voltage waveform on $C_p$, shown at the bottom of FIG. 3 closely matches the shape of that produced by an equivalent thyrtaron-switched pulsed power module, except that the SRC waveform exhibits little or no after-ringing. The increased complexity of the SSPPM is compensated for by the elimination of the expensive and short-lived thyratron. An additional and important feature of the SSPPM is the recovery of the energy reflected from the laser chamber as shown in FIG. 4. With the SSPPM, the energy reflected by the laser chamber due to impedance mismatch no longer rings back and forth between the SSPPM and the laser chamber. The SSPPM circuit is designed to transmit this reflected energy all the way back through the pulse forming network into $C_0$. Upon recovery of this energy onto $C_0$, the SCR switches off ensuring that this captured energy remains on $C_0$. Thus, regardless of the operating voltage, gas mixture, or chamber conditions, the voltage waveform across the laser electrodes exhibits the behavior of a well-tuned system. This performance is maintained over all laser operating conditions.

Spectral Narrowing

As stated earlier, bandwidth (FWHM) of a free running KrF excimer laser is approximately 300 pm. Currently, an excimer steppers utilize lasers spectrally narrowed to between 0.8 and 3 pm, FWHM, depending on the NA of the lens. It should be noted that the integrated energy spectrum and the spectral width at 95% energy are more critical to stepper performance than the FWHM value. However, most users find it convenient to talk about FWHM instead of spectral width at 95% energy.

Spectral narrowing of a KrF laser is complicated by its short pulse duration (10 to 15 ns, FWHM and UV wavelength. The short pulse results in very high intracavity power ($\sim 1$ MW/cm$^2$), and the short wavelength can thermally distort optical materials due to their high absorption co-efficient at 248 nm. Also, the total number of round trips through the resonator (which includes the line narrowing optical elements) for a typical laser is small, about 3 to 4. If the single pass linewidth through the resonator is denoted by $\Delta\lambda_1$, then the final linewidth $\Delta\lambda_f$ after n passes is given by:

$$\Delta\lambda_f = \frac{\Delta\lambda_1}{\sqrt{n}}$$

Therefore, the single pass linewidth of the optical system should be, at most, a factor of two higher than the final linewidth. In fact, time resolved spectral measurements by Applicants' fellow workers indicate that the spectral linewidth could decrease by a factor of two from the start of the pulse to the tail of the pulse. Therefore, the efficiency of converting the broadband spectrum to line narrowed spectrum (i.e. from 300 pm to <1 pm) of the optical system must be very high.

Figure 7:
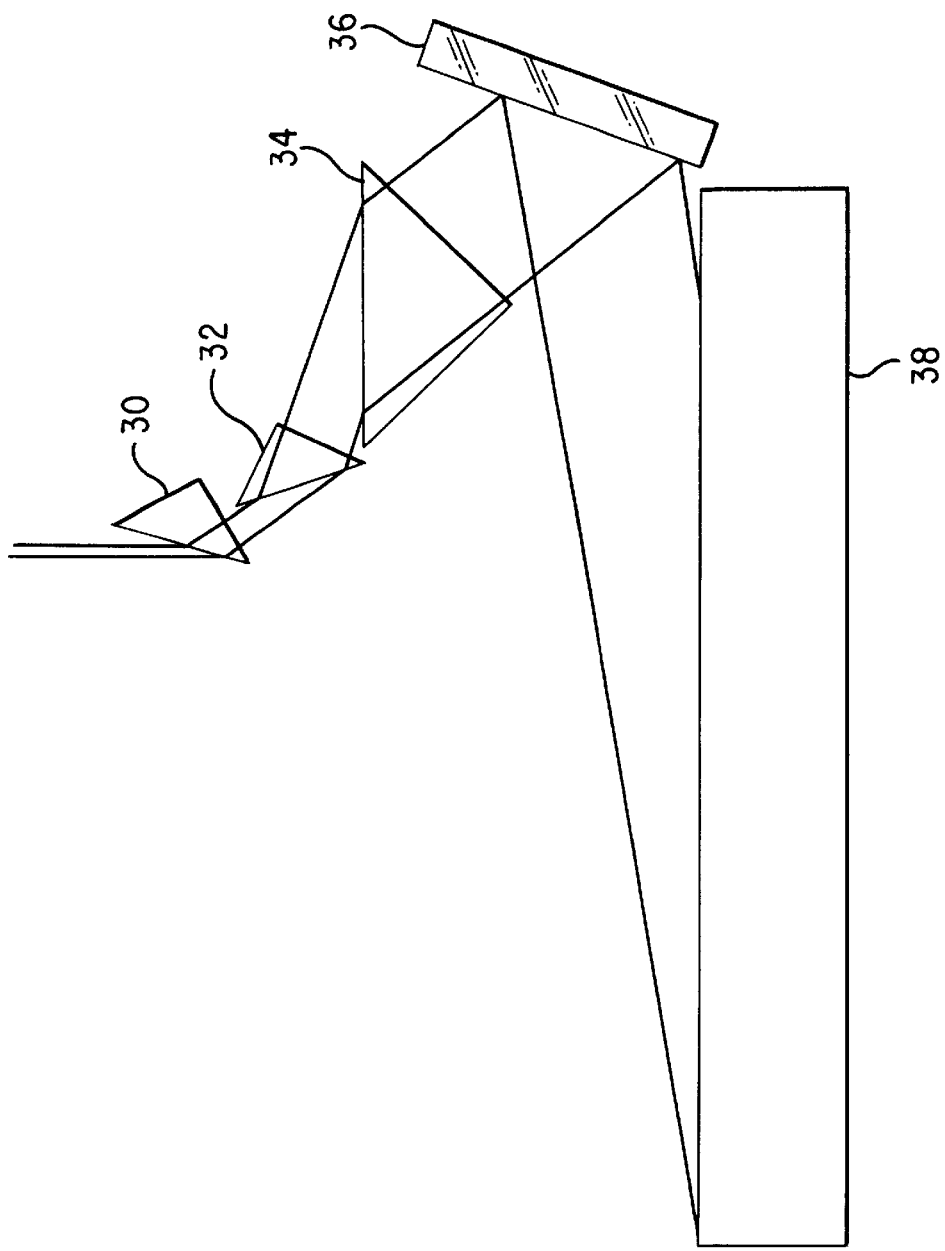
FIG. 7 is a sketch of the principal element of a line narrowing module.

The common technique of line-narrowing the KrF laser is by introducing wavelength dispersive optical elements in the resonator. Three types of dispersive elements can be used: prisms, etalons and gratings. The use of a high dispersive grating in a Littrow configuration is the simplest and most effective spectral line narrowing technique. Because the grating is a dispersive element, the line-width is proportional to the beam divergence. To get narrow line-width, a small beam divergence is required. Hence, 2 slits and 3 prisms beam expanders are inserted in the laser resonator. The principal elements of a preferred line narrowing module are shown in FIG. 7. These include 3 prisms; 30, 32 and 34, a tuning mirror, 3C and a eschelle grating, 38. The mirror is pivoted to change the wavelength of the laser.

Improved Spectral Performance

Applicants and their fellow workers have designed, built and tested laser KrF excimer laser equipment capable of meeting linewidth specifications of 0.50 pm at FWHM with 95% of the energy of the laser beam within 2 pm. These results have been demonstrated on new, mid-age and old discharge chambers for 80 million pulses proving that the system is capable of continuous performance within these specifications over the normal life of the equipment with usual maintenance. These results represent an approximately 50% improvement over the prior art narrow band excimer laser technology.

In order to achieve this improved performance Applicants have improved both the laser equipment and the operating parameters of the laser.

Reduction of Fluorine Consumption

In preferred embodiments of the present invention which have been built and tested by Applicants, great care was taken to eliminate materials from the discharge chamber that consume fluorine. Fluorine consumption in a discharge chamber is due to fluorine reaction with materials in the chamber. These reactions typically produce contaminants which result in deterioration of laser performance. In order to minimize fluorine consumption, this preferred embodiment includes the following specific features:

The chamber walls are aluminum coated with nickel.
The electrodes are brass.
All metal O-rings are used as seals.
Insulators are all ceramic and fluorine compatible.
Alumina is applicant's preferred insulator material.
An electrostatic filter is provided as in prior art designs to filter contaminants produced during operation.
The fan unit is driven using a magnetically coupled motor located outside the sealed discharge chamber using a prior art technique.

During manufacture, parts are precision cleaned to remove potential contaminants.

After assembly, the chamber is passivated with fluorine.

Reduction of Nominal Fluorine Concentration

This preferred embodiment requires substantial changes in operating procedures and parameters of the laser system in order to achieve the desired very narrowband output. The fluorine concentration in reduced from 0.1% (30 kPa) to about 0.06% (18 kPa). The total gas pressure is about 300 kPa. (The Kr concentration is maintained at the prior art level of about 1.3% and the remainder of the laser gas is neon.) During operation, fluorine will be gradually depleted. Constant pulse energy is obtained by gradually increasing the laser operating voltage in accordance with prior art techniques. Injections of a mixture of fluorine and neon are made periodically (typically at intervals of about 1 to 4 hours) to make up for the depletion of fluorine in accordance with techniques well known in the excimer laser prior art. During this procedure, the fluorine concentration is preferably maintained within the range of between about 0.055% and 0.065% and the operating voltage is maintained within a corresponding range appropriate to maintain constant pulse energy. For example, in a preferred embodiment this range was 770 Volts to 790 Volts.

Increase in Reflectivity of Output Coupler

In this preferred embodiment of the present invention the reflectivity of the output coupler has been increased from about 10% which was typical of prior art narrow band excimer lasers to about 30%. This was done to help make up for the loss of laser efficiency resulting from the reduced fluorine concentration.

Switch to Calcium Fluoride Prisms

The change in the reflectivity of the output coupler from 10% to 30% had the effect of approximately doubling the light passing through the line narrowing module. The additional heat generated by this additional illumination in the prior art fused silica prisms caused thermal distortion in the prisms. To solve this problem the fused silica prisms were replaced with calcium fluoride prisms. Calcium fluoride has higher thermal conductivity and could handle the additional energy without unacceptable distortion.

Results

Figure 10:
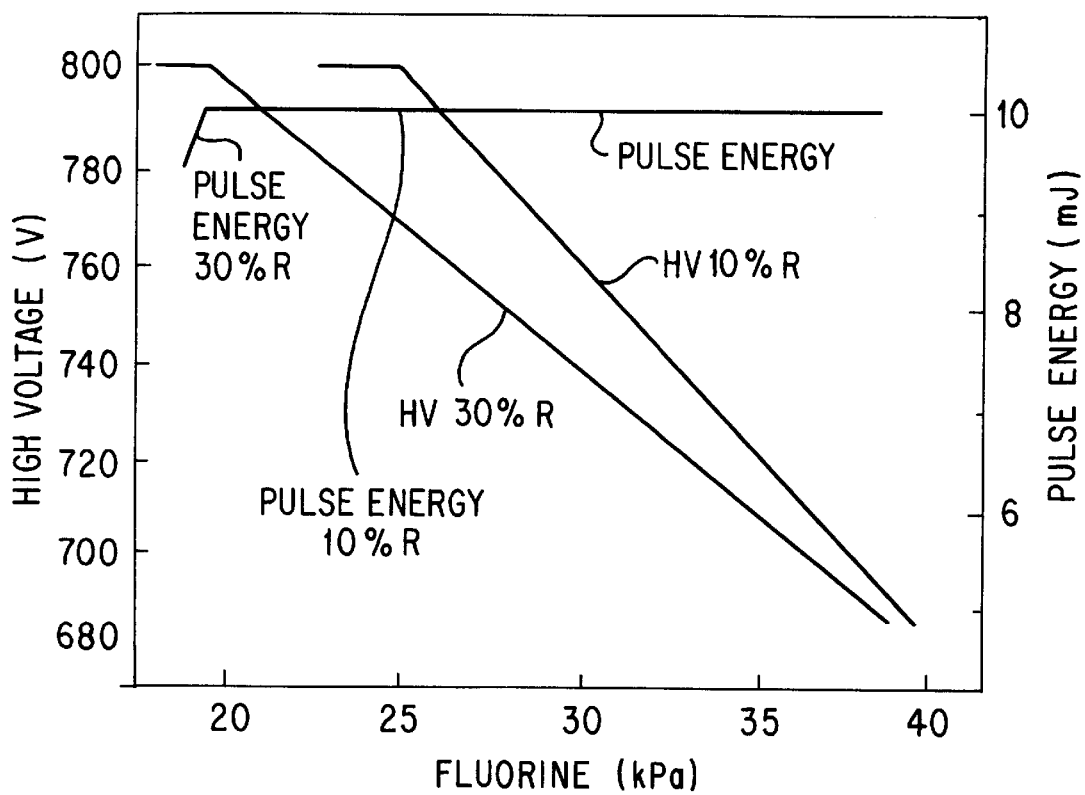
FIG. 10 shows the relationship between fluorine, operating voltage and pulse energy.
Figure 11:
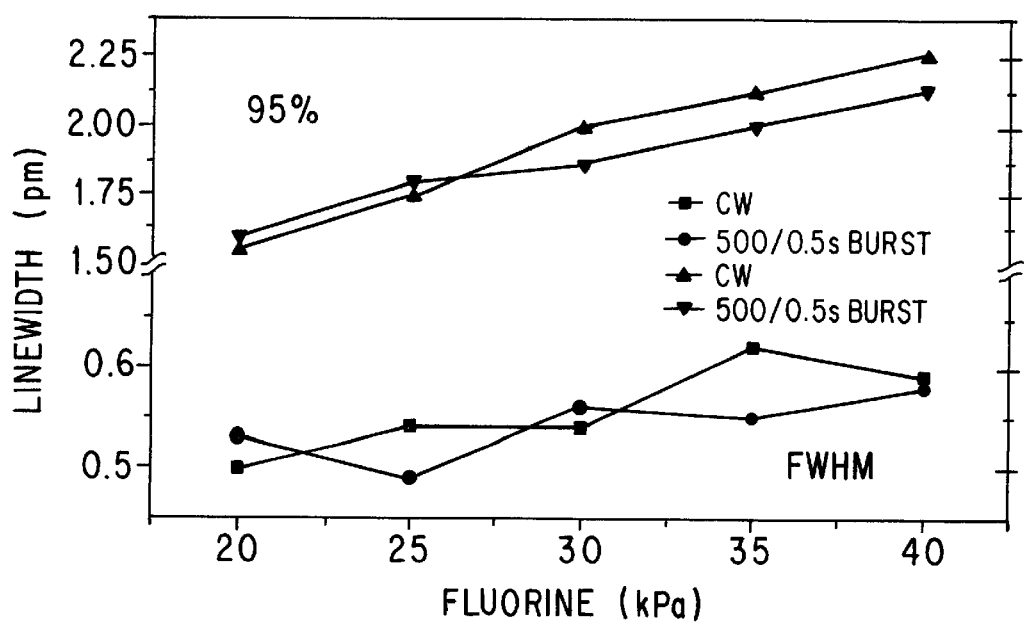
FIG. 11 shows the variation of line width with fluorine concentrations.
Figure 12A:
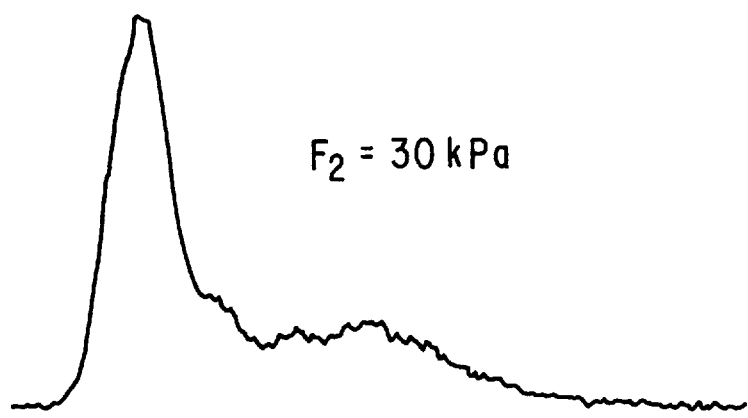
FIGS. 12A and 12B show pulse shape with different fluorine concentrations.
Figure 12B:
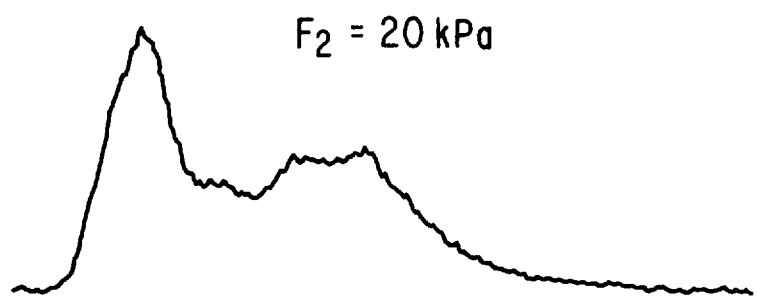

Results of the changes included in this embodiment of the present invention are described in FIG. 10, FIG. 11 and FIG. 13. FIG. 10 describes the relationship between operating voltage, fluorine concentration and pulse energy. This graph shows that fluorine concentration decreases the voltage must be increased to maintain the desired output of 10 mJ per pulse. However, in this particular embodiment the upper limit on the operating voltage is 800 Volts. Note that with a 10% R output coupler the lowest fluorine concentration corresponding to an output of 10 mJ would be 25 kPa at which point the operating voltage would have risen to 800 Volts. However with a 30% R output coupler, the fluorine concentration could be reduced to as low as about 20 kPa while still maintaining a 10 mJ pulse energy with the operating voltage at slightly under 800 Volts. FIG. 11 shows actual test results of reducing the fluorine concentration on line width (measured at FWHM and at 95% pulse energy) for both continuous pulses at 1000 Hz and for 500 pulse bursts and 1000 Hz. For this particular test the output coupler had a 25% reflectivity. Typical laser pulse shapes for prior are KrF systems and these very narrowband KrF lasers are compared in FIGS. 12A and 12B. Note that with the very narrowband lasers, energy is shifted to the latter part of the pulse which represents photons which have had the benefit of more trips through the line narrowing module. As a result, the integrated pulse spectral linewidth of the laser is reduced.

Wavelength and Bandwidth Measurement

The center wavelength of the lithography laser output radiation has to be stabilized in order to: a) maintain focus at the wafer plane, and b) minimize any change in magnification. Drift in center wavelength, however, affects the focal plane stability more severely than magnification. The variation of the central wavelength at the start of a burst of pulses is also important. In the following sections, we will describe a wavemeter which measures most of the spectral requirements for lithography. The wavemeter measures the wavelength and tunes the line narrowing optics (etalon or grating) to compensate for any deviation from target wavelength.

The wavemeter used for a production lithography laser has to be compact and yet meet the requirements of good relative accuracy, small long term drift, and a good absolute precision with reference to an atomic line. The requirement in each case is $<\pm 0.15$ pm. Further, the wavelength measurement has to be insensitive to changes in the ambient temperature or pressure. In addition, the wavemeter should be capable of measuring the spectral bandwidth (FWHM) with an accuracy of $\pm 0.15$ pm. The operating range of this wavemeter, on the other hand, can be relatively small, $248.35 \pm 0.30$ nm.

Figure 8:
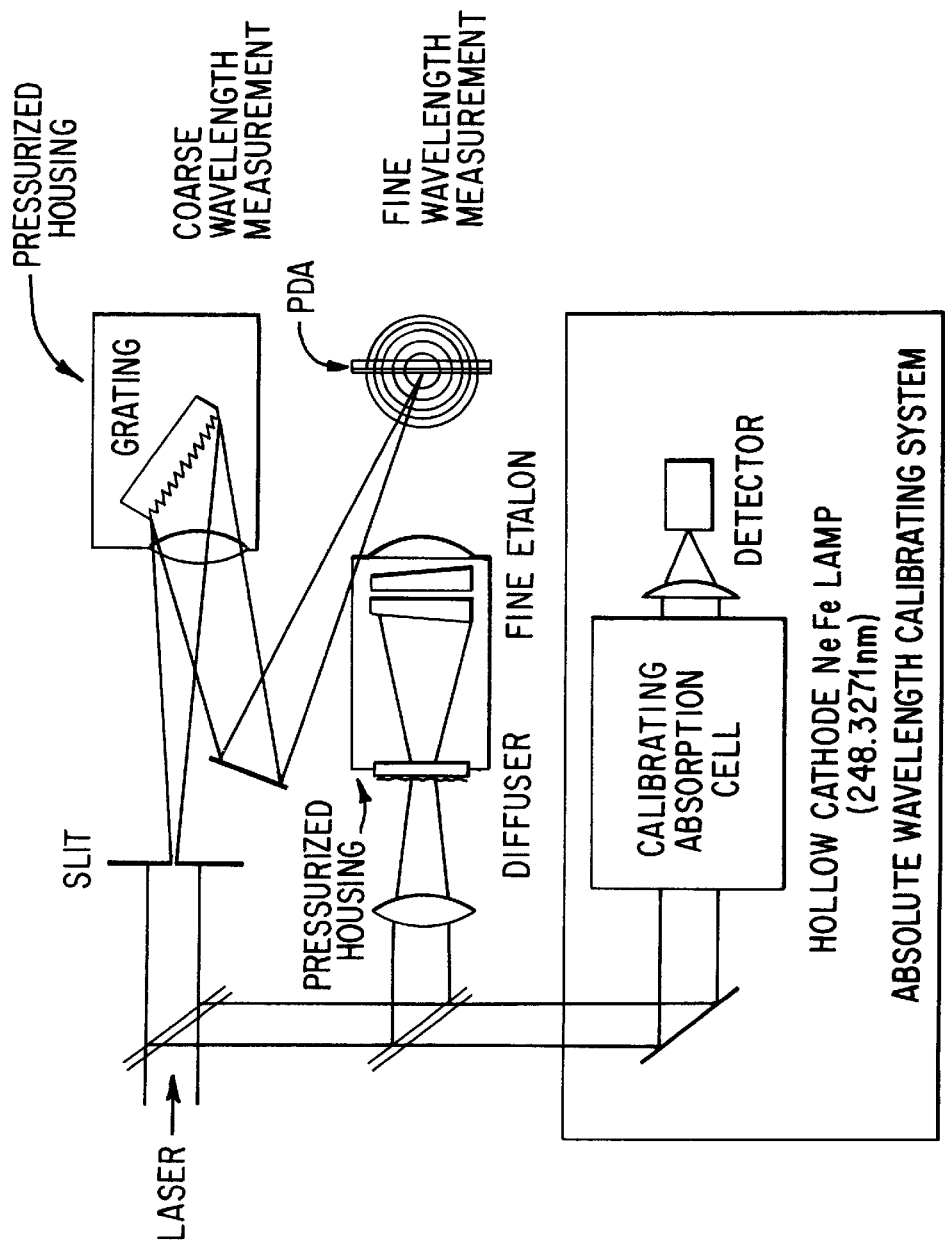
FIG. 8 shows how the wavelength of the laser is controlled.
Figure 9:
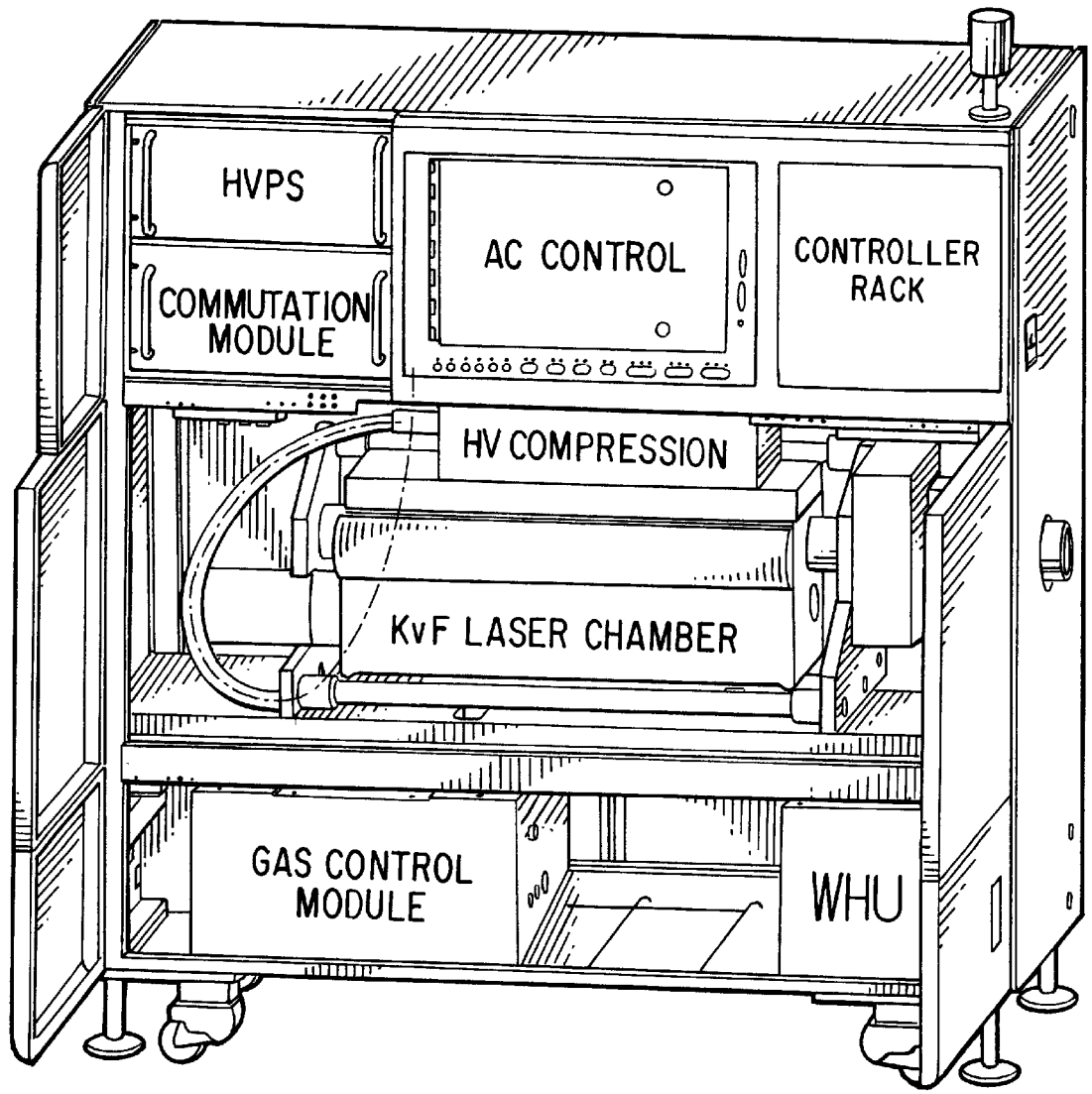
FIG. 9 is a drawing of a prior art commercial KrF lithography laser.

The wavelength is measured using a combination of a grating and an etalon. A schematic layout of this wavemeter is shown in FIG. 8. The grating and the etalons are used respectively for coarse and fine measurements. The output from the grating spectrometer is imaged in the central region of a 1024 element silicon photo diode array, while the fringe pattern from the etalon is imaged on the two sides. The wavelength is determined by measuring the diameter of the etalon fringe pattern and the position of the coarse grating output.

A small change in fringe diameter is proportional to change in the wavelength. For wavelength change less than the free spectral range (FSR) of the etalon, the etalon is capable of tracking the wavelength of the laser. The coarse grating measurement is necessary to eliminate any possible error or discrepancy in the laser wavelength drift of greater than the free spectral range (FSR) of the etalon (20 pm). As is well known, the etalon fringe pattern is identical for wavelengths separated by multiples of its FSR.

The wavemeter is calibrated at the factory with reference to a hollow cathode Ne-Fe lamp which has an absorption peak at 248.3271 nm. Experience has shown that these wavemeters can be made stable to within $\pm 0.5$ pm. Furthermore, to eliminate ambient pressure dependent changes, both the grating and the etalon are housed inside individual pressurized housings. Temperature stability is achieved by using very low thermal expansion coefficient etalon spacers and good thermal management of the etalon housing.

Finally, the wavelength information obtained from the Wavemeter is used to control laser wavelength by changing the angle of illumination on the grating in the line narrowing module. This is done by very slightly pivoting mirror 36 shown in FIG. 7.

Although this very narrow band laser has been described with reference to a particular embodiment, it is to be appreciated that various adaptations and modifications may be made and the invention is only to be limited by the appended claims.

We claim:

1. A very narrow band KrF excimer laser comprising:
   A. a laser chamber comprised of fluorine compatible materials and containing:
      (1) two elongated electrodes;
      (2) at least one preionizer;
      (3) laser gas defining a total pressure and comprised of krypton, fluorine and a buffer gas, said fluorine having a partial pressure of less than 0.08 of the total pressure;
   B. a line narrowing module comprised of:
      (1) at least one beam expanding prism;
      (2) a grating;
      (3) a tuning means for tuning the grating; and
   C. an output coupler having a reflectance of at least 25%.

2. A very narrow band excimer laser as in claim 1 wherein said at least one prism is comprised of calcium fluoride.

3. A very narrow band excimer laser as in claim 1 wherein at least one prism is three prisms, all comprised of calcium fluoride.

4. A very narrow band excimer laser as in claim 1 wherein the partial pressure of fluorine is less than 0.06 percent of the total gas pressure.

* * * * *